United States Patent
Guarini et al.

(10) Patent No.: US 6,911,375 B2
(45) Date of Patent: Jun. 28, 2005

(54) METHOD OF FABRICATING SILICON DEVICES ON SAPPHIRE WITH WAFER BONDING AT LOW TEMPERATURE

(75) Inventors: Kathryn W. Guarini, Yorktown Heights, NY (US); Louis L. Hsu, Fishkill, NY (US); Leathen Shi, Yorktown Heights, NY (US); Dinkar V. Singh, White Plains, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 10/452,715

(22) Filed: Jun. 2, 2003

(65) Prior Publication Data
US 2004/0241958 A1 Dec. 2, 2004

(51) Int. Cl.$^7$ .............................................. H01L 21/30
(52) U.S. Cl. ........................ 438/455; 438/118; 438/458
(58) Field of Search ................................. 438/118, 455, 438/456, 457, 458, 459, 460, 464, 977

(56) References Cited

U.S. PATENT DOCUMENTS

| | | | |
|---|---|---|---|
| 5,455,202 A | * 10/1995 | Malloy et al. | ............. 438/118 |
| 6,383,890 B2 | * 5/2002 | Takisawa et al. | ........... 438/455 |
| 6,686,630 B2 | * 2/2004 | Hanafi et al. | ............... 257/366 |
| 6,774,010 B2 | * 8/2004 | Chu et al. | ................... 438/458 |

* cited by examiner

*Primary Examiner*—Kevin M. Picardat
(74) *Attorney, Agent, or Firm*—Scully, Scott, Murphy & Presser; Robert M. Trepp, Esq.

(57) ABSTRACT

Described is a method for making silicon on sapphire structures, and devices therefrom. The inventive method of forming integrated circuits on a sapphire substrate comprises the steps of providing a device layer on an oxide layer of a temporary substrate; bonding the device layer to a handling substrate; removing the temporary substrate to provide a structure containing the device layer between the oxide layer and the handling substrate; bonding a sapphire substrate to the oxide layer; removing the handling substrate from the structure; and annealing the final structure to provide a substrate comprising the oxide layer between the device layer and the sapphire substrate. The sapphire substrate may comprise bulk sapphire or may be a conventional substrate material with an uppermost sapphire layer.

19 Claims, 4 Drawing Sheets

METHOD OF FABRICATING SILICON DEVICES ON SAPPHIRE WITH WAFER BONDING AT LOW TEMPERATURE

DESCRIPTION

1. Field of Invention

The present invention relates to the fabrication of semiconductor devices as well as passive components on a sapphire substrate. More specifically, the present invention relates to forming semiconductor devices as well as passive components on a sapphire substrate using low temperature wafer bonding techniques.

2. Background of the Invention

The excellent dielectric properties of sapphire (low dielectric loss tangent, tan δ <0.0001 at 3 GHz and high resistivity $\rho=10^{14}$ ohm-cm) make it an ideal substrate for high frequency circuit applications. In addition to reducing device parasitics, sapphire is also expected to significantly improve the performance of passive elements such as inductors, transmission lines, etc. The high thermal conductivity of sapphire ($K_{sapphire}$=0.46 W/cm-K, compared to $K_{SiO_2}$=0.014 W/cm-k), also reduces self-heating effects (which degrade device performance) compared to conventional silicon-on-insulator (SOI) technologies having a thick buried $SiO_2$ layer. Self-heating effects occur in devices with poor thermal conductivity where the device temperature increases as current flows through the device.

Silicon-On-Sapphire (SOS) has been produced in the prior art using a heteroepitaxial growth process of silicon on the surface of a sapphire substrate. Unfortunately, due to the large lattice mismatch, as well as differences in the coefficient of expansion between silicon and sapphire, heteroepitaxial growth of silicon on sapphire substrates results in a high density of threading defects (on the order of $10^8$ cm$^{-2}$) in the silicon layer. Threading defects may be due to a difference in thermal expansion between the silicon and sapphire layers, and extends from the interface between the silicon layer and sapphire layer to the upper surface of the silicon layer. The presence of a high density of defects in hetereoepitaxial silicon on sapphire substrates limits the device performance and yield. The impact of the difference in the coefficient of thermal expansion between silicon and sapphire on the Si material quality is exacerbated by the requirements of high temperature processing inherent in heterocoepitaxial growth. Since the high density of threading defects will be replicated in epitaxial layers grown on these substrates, technologically important materials such epitaxial SiGe on SOS substrates will also have a high defect density. In addition, processing Si or SiGe on sapphire substrates is expensive due to the need for developing new tools and processes compatible with sapphire substrates.

In view of the drawbacks mentioned above, there is a need to provide a method for forming integrated circuits comprising semiconductor devices and passive components on a sapphire substrate, while maintaining a low defect density.

SUMMARY OF THE INVENTION

The present invention provides a method for fabricating silicon-on-sapphire structures, and the devices therefrom. The present invention provides a method, which utilizes conventional semiconductor processing for producing a device region on a temporary substrate and then transferring the device region to a sapphire substrate by wafer bonding at a low temperature (T≦400° C.). Wafer bonding thus provides a low temperature bond between the sapphire substrate and the oxide layer underlying the device region, therefore avoiding high temperature processing steps. Low temperature wafer bonding techniques offer a cost effective approach for producing low defect density integrated circuits on a sapphire substrate, including both semiconductor devices and passive elements.

In broad terms, the inventive method of fabricating integrated circuits on a sapphire substrate comprises the steps of:

providing a device layer on an oxide layer of a temporary substrate;

bonding the device layer to a handling substrate;

removing the temporary substrate to provide a structure containing the device layer between the oxide layer and the handling substrate;

bonding a sapphire substrate to the oxide layer;

removing the handling substrate from the structure; and annealing the final structure to provide a substrate comprising the oxide layer between the device layer and the sapphire substrate.

More specifically, a stacked structure is first provided including at least a temporary substrate having a device layer atop an oxide layer of the temporary substrate. The device layer, which may include an integrated circuit, is first completely fabricated on a temporary substrate that may preferably be a silicon-on-insulator substrate (SOI).

The top surface of the processed device layer is then attached to a handling substrate. The attachment may be performed using glue, an adhesive, or even by direct bonding which is based on van der Waals attractive forces between two optically smooth surfaces.

Once the device wafer has been attached to the handling substrate, the temporary substrate is removed by wafer grinding, chemical mechanical polishing (CMP), wet etching, dry etching or a combination thereof, stopping on the oxide surface layer, which acts as an etch stop layer. The handling substrate provides support for the device region following the removal of the temporary substrate. After the temporary substrate is removed, a surface of the oxide layer is exposed. Additionally, a low temperature oxide layer may be deposited atop the exposed oxide layer.

The exposed surface of the oxide layer is then bonded to the surface of a sapphire substrate. The sapphire substrate may comprise bulk sapphire or may be a conventional substrate material with an uppermost sapphire layer. The sapphire substrate may also comprise a multilayered structure where the uppermost layer is a sapphire layer. In the present invention, direct bonding is preferred over adhesive bonding due to the improved thermal conductivity across the oxide/sapphire interface compared to an oxide/adhesive/sapphire interface.

Following bonding to the sapphire wafer, the handling wafer is then removed. This results in the complete transfer of the device layer onto a sapphire substrate.

DETAILED DESCRIPTION OF THE INVENTION

Figure 1:
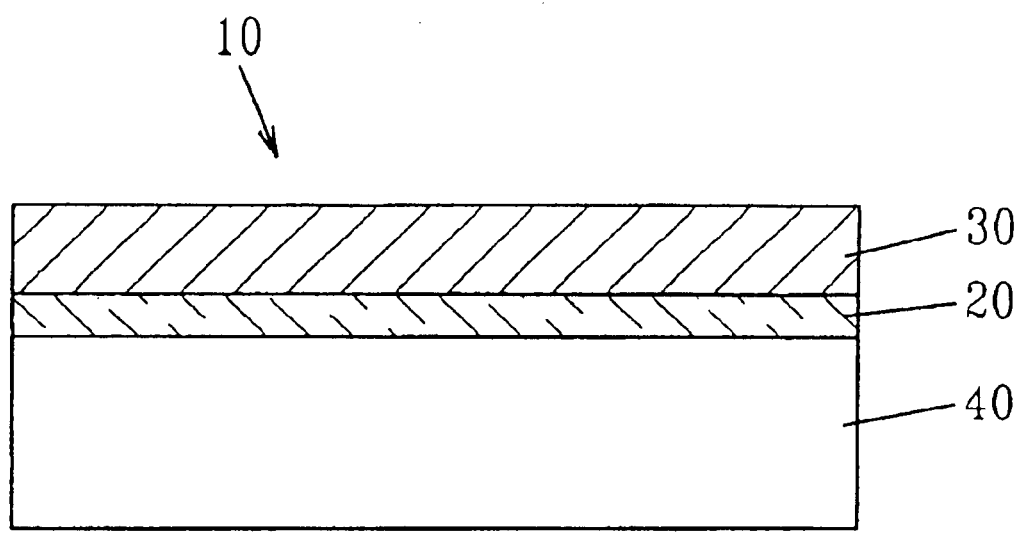
FIG. 1 is a pictorial representation (through a cross sectional view) of the initial stack structure with a device layer.

The present invention, which provides a low temperature (<400° C.) method for fabricating silicon on sapphire structures, will now be described in greater detail by referring to the drawings that accompany the present application. It should be noted that in the accompanying drawings, like reference numbers are used for describing like and corresponding elements.

FIG. 1 illustrates the cross section of a starting wafer 10 including a layered stack of at least a fully processed device layer 30, an oxide layer 20, and a temporary substrate 40.

The device layer 30 may include an integrated circuit having active regions and passive regions. The active regions may include metal oxide semiconductor (MOS) devices, complementary metal oxide semiconductor (CMOS) devices, bipolar devices, modulation doped field effect (MODFET) devices, and combinations thereof. The passive regions may include inductors, resistors, capacitors, transmission lines and combinations thereof. The device layer may comprise a layer containing Si, strained Si, $Si_{1-y}C_y$, $Si_{1-x-y}Ge_xC_y$, $Si_{1-x}Ge_x$, Si alloys, Ge, Ge alloys, GaAs, InAs, InP as well as other III–V and II–VI semiconductors, formed using conventional semiconductor processing techniques, which are well known to those skilled in the art.

The temporary substrate 40 may be a semiconductor or insulating substrate. The term "semiconductor" as used herein denotes any semiconducting material including, but not limited to: Si, strained Si, SiC, SiGe, SiGeC, Si alloys, Ge, Ge alloys, GaAs, InAs, InP as well as other III–V and II–VI compound semiconductors. The term 'semiconductor' also includes a silicon-on-insulator (SOI) wherein a buried insulating material, particularly an oxide, separates a top Si-containing layer from a bottom Si-containing layer. The term "insulating substrate" denotes a substrate material that has properties of an insulator, yet can be used as a substrate. Examples of such insulating materials include, but are not limited to: silicon oxide, silicon nitride, sapphire, aluminum nitride, boron nitride, beryllium nitride and the like.

Still referring to FIG. 1, an oxide layer 20 is formed underlying the device layer 30 and atop the temporary substrate 40. The oxide layer 20 may be formed by implanting a high-energy dopant into the temporary substrate 40 and then annealing the structure to form a buried oxide layer below the surface of the starting wafer 10. The buried oxide layer can also be formed by other prior art techniques for forming silicon-on-insulator substrates, e.g., high temperature wafer bonding. Alternatively, the oxide layer 20 may be deposited or grown prior to the formation of the device region. The oxide layer 20 acts as an etch stop during later processing steps for removing the temporary substrate 40.

Figure 2:
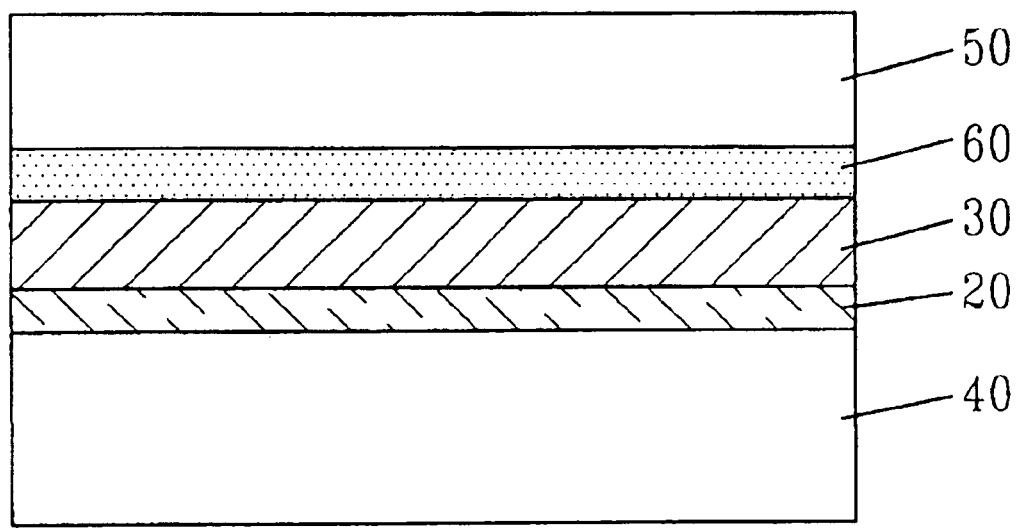
FIG. 2 is a pictorial representation (through a cross sectional view) of the initial stack of FIG. 1 further including a temporary handling substrate.

Referring to FIG. 2, an upper exposed surface of the device layer 30 is bonded to a handling substrate 50. Handling substrate 50, similar to temporary substrate 40, may be a semiconductor or insulating substrate. The handling substrate 50 may also comprise glass or glass-like materials. More specifically, the handling substrate may comprise glass, quartz, silicon nitride, aluminum nitride, berylium oxide, sapphire, Si, strained Si, SiC, SiGe, SiGeC, Si alloys, Ge, Ge alloys, GaAs, InAs, InP, other III–V or II–VI semiconductors, and combinations thereof. Bonding between the handling substrate 50 and the device layer 30 is achieved by applying a glue or polymer based adhesive 60 to the surface of the device layer 30 and the handling substrate 50 to be joined. Alternatively, the device layer 30 and the handling substrate 50 may be bound by direct bonding. Direct bonding requires that the surfaces to be bond be substantially planar. Direct bonding will be discussed in greater detail to follow. Layer 60 is optional and may not be present when a direct bonding approach is utilized.

Figure 3:
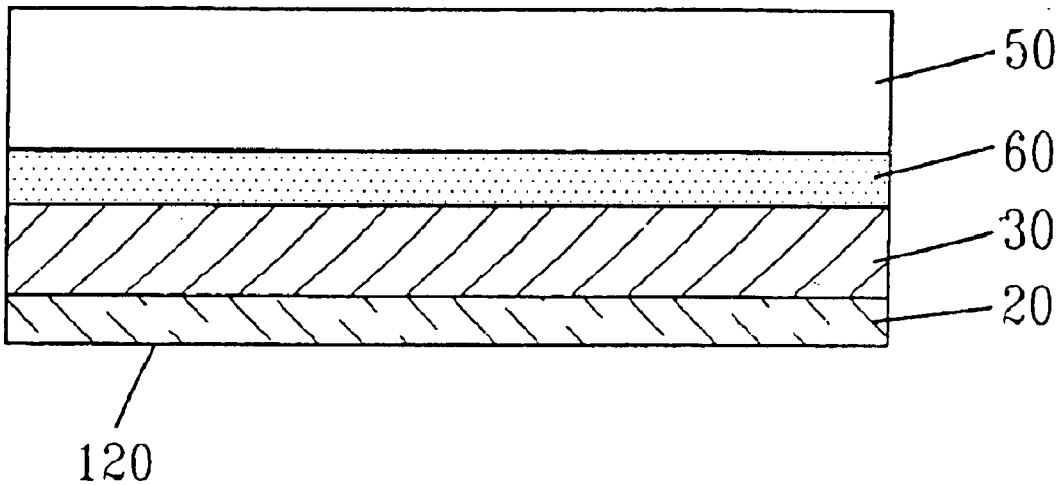
FIG. 3 is a pictorial representation (through a cross sectional view) of the structure of FIG. 2 after the removal of the temporary substrate.

Referring to FIG. 3, following the bonding of the handling substrate 50, the temporary substrate 40 is removed to expose a surface 120 of the oxide layer 20. Temporary substrate 40 is removed using grinding, polishing, wet etch, dry etch or any combination thereof.

Preferably, temporary substrate 40 is removed using a combination of wafer grinding and wet etching. The etchant used during the wet etch process may comprise potassium hydroxide (KOH), ethylene diamine pyrocatechol (EDP) or tetramethyl-ammonium hydroxide (TMAH). The chemical etchant is selective to oxide so that the oxide layer 20 acts as an etch stop during the removal of the temporary substrate 40.

Alternatively, the temporary substrate 40 may be removed using a combination of dry etching, i.e., reactive ion etch (RIE), laser etching, ion beam etching; chemical mechanical polishing (CMP); exfoliation; and delamination techniques such as "smart cut". Smart cut is a method comprising implanting hydrogen into the initial wafer 10 and then annealing the initial wafer 10 to produce hydrogen bubbles. The bubbles formed within the initial wafer 10 cause a shear mechanism that removes the temporary substrate 40. "Smart cut" annealing occurs at a temperature of about 500° C. Another, preferred shearing method, "smarter cut" includes a boron and hydrogen implant that causes sheer after being annealed at a temperature of approximately 180° C.

Still referring to FIG. 3, the exposed surface 120 of the oxide layer 20 may then be polished by chemical mechanical polishing (CMP), if required, to reduce the root mean square (RMS) surface roughness to a value suitable for direct wafer bonding. Direct wafer bonding requires that the surfaces to be bonded be substantially planar. A surface RMS roughness value suitable for direct bonding is about 0.5 nm.

When it is necessary to perform a polishing step, the polished surfaces are typically cleaned after polishing to remove particulate residue. Any conventional cleaning process that is capable of removing particulate residue formed after polishing may be employed. Specifically, the cleaning process may be performed utilizing a brush clean followed by either deionized (DI) water rinse or a chemical cleaning composition. Typically, the chemical cleaning composition consists of ozone rinse, followed by a Huang A ($NH_4OH:H_2O_2:H_2O$) dip, followed by a Huang B ($H_2O:HCl$) dip, with DI water rinses after each chemical treatment.

Figure 4:
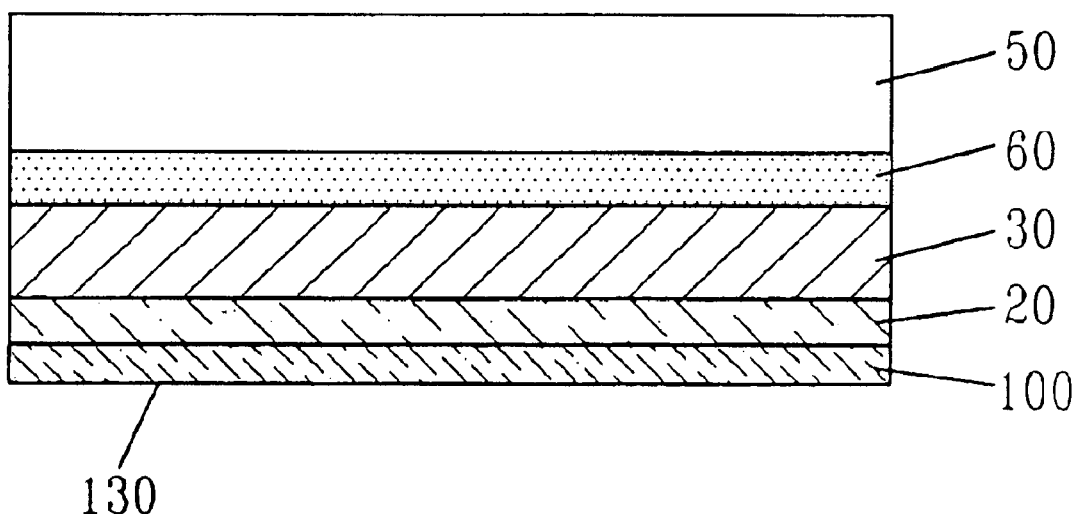
FIG. 4 is a pictorial representation (through a cross sectional view) of the structure of FIG. 3 including a layer of a low temperature oxide deposited on the oxide layer.

Referring to FIG. 4, if the oxide layer 20 is too thin to allow CMP, a low temperature oxide layer 100 may be formed on the exposed oxide surface 120. Specifically, the low temperature oxide layer 100 is formed by a deposition process. By low temperature oxide, it is meant an oxide layer that is formed at a temperature of about 400° C. or less. Suitable deposition processes include, for example, chemical vapor deposition (CVD), low pressure CVD, plasma-enhanced CVD and other like low temperature deposition processes. Alternatively, an oxidation process may be employed in forming the low temperature oxide layer 100. When oxidation is employed, the oxidation process is performed in an oxygen-containing ambient which includes, but is not limited to: pure $O_2$, air, ozone, steam and other like oxygen-containing ambients. The oxygen containing ambient may, in some embodiments, be admixed with an inert gas such as He, Ar, Xe, Kr and mixtures thereof.

Still referring to FIG. 4, the device containing the low temperature oxide layer 100 is then annealed to reduce the concentration of —OH groups on the surface of the low temperature oxide layer 100. The annealing of the low temperature oxide layer 100 is typically conducted at a temperature of less than 400° C. to prevent any degradation in the electrical properties of the device layer 30. The exposed low temperature oxide surface 130 is then polished by chemical mechanical polishing (CMP), if required, and cleaned.

Sapphire substrate 140 is then bonded to an exposed oxide surface, either being the exposed oxide surface 120 of the oxide layer 20, as depicted in FIG. 3, or the exposed low temperature oxide surface 130, as depicted in FIG. 4; opposite the handling substrate 50.

The sapphire substrate 140 may comprise bulk sapphire or may be a conventional substrate material with an uppermost sapphire layer. The sapphire substrate 140 may also comprise a multilayered structure in which the uppermost layer is a sapphire layer. In a preferred embodiment, the sapphire substrate is bonded by direct wafer bonding to an exposed oxide surface. Alternatively, bonding the sapphire substrate 140 to exposed oxide surface may include contacting the exposed oxide surface and the sapphire substrate 140 with a glue or polymer adhesive.

Preferably, when utilizing direct wafer bonding techniques, both the exposed oxide surface and the surface of the sapphire substrate 140 are surface treated to activate the surfaces and to render the surfaces suitable for direct bonding. Suitable surface treatments typically include wet chemical treatments involving ammonium hydroxide, nitric acid, sulfuric acid, hydrogen peroxide, or periodic acid ($H_5IO_6$) which terminate the surfaces with hydroxyl groups, thereby promoting bonding between the mating surfaces, i.e., exposed oxide surface 120, exposed low temperature oxide surface 130, and sapphire substrate 140, by the initial formation of hydrogen bonds and the subsequent formation of stronger siloxane bonds. More specifically, the exposed oxide surface and the sapphire substrate are first terminated by —OH groups and then, as the surfaces are brought into contact, the hydrogen from one OH terminated surface bonds with the oxygen from the other OH terminated surface. Additionally, when annealed, a water molecule is released, and a Si—O—Al bond is formed across the interface between the sapphire substrate and the exposed oxide surface to provide strong bonding.

More specifically, surface 130, 120 and sapphire film 140 may be exposed to a $NH_4OH$ solution for varying lengths of time and temperature. This treatment may be performed by immersing the wafers into a $NH_4OH$ solution, dip coating, spray coating, or by brushing. The $NH_4OH$ treatment step is typically performed at about room temperature, but elevated temperatures are also contemplated herein. While not wishing to be bound by any theory, it is believed that the wet chemical treatment involving $NH_4OH$ is extremely efficient at hydroxylating the mating surfaces of the wafers, thereby resulting in strong bonding across the bonding interface.

Alternatively, activating the exposed oxide surface and sapphire surface, prior to direct bonding, may include the application of oxygen, ammonia, or water plasma. It is speculated that immersing the bonding surfaces in a plasma may help clean the surface of organic contaminants, while facilitating the termination of the surfaces with the —OH groups resulting in strong direct bonding.

Figure 5:
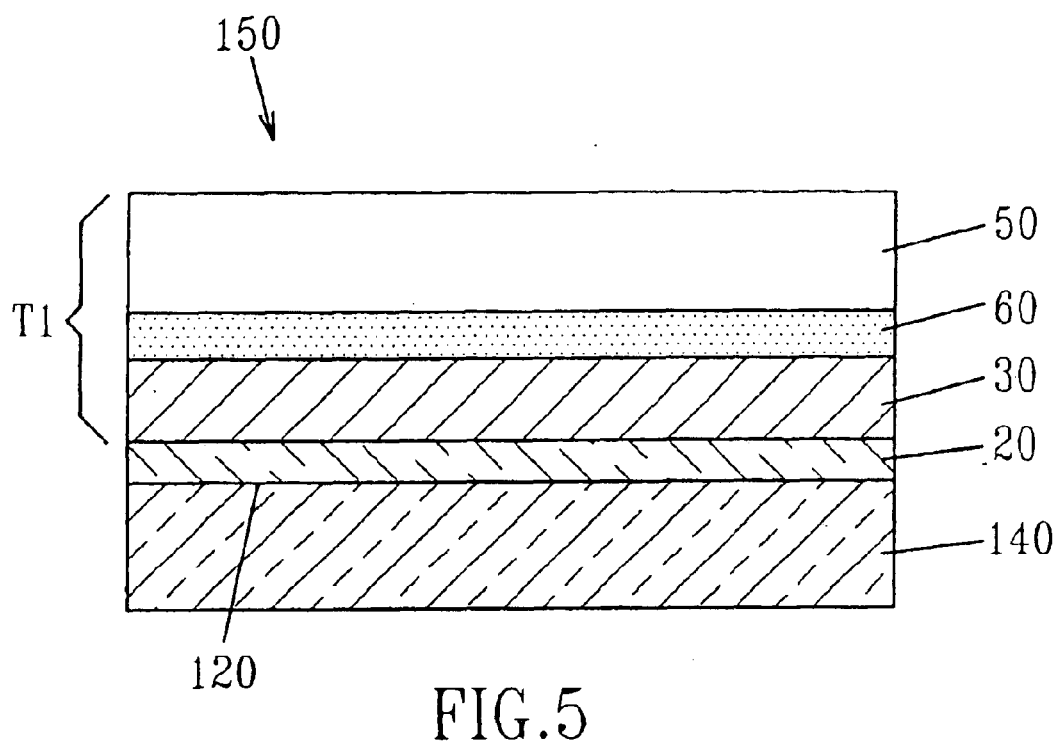
FIG. 5 is a pictorial representation (through a cross sectional view) of the structure shown in FIG. 3 bonded to a sapphire substrate.
Figure 6:
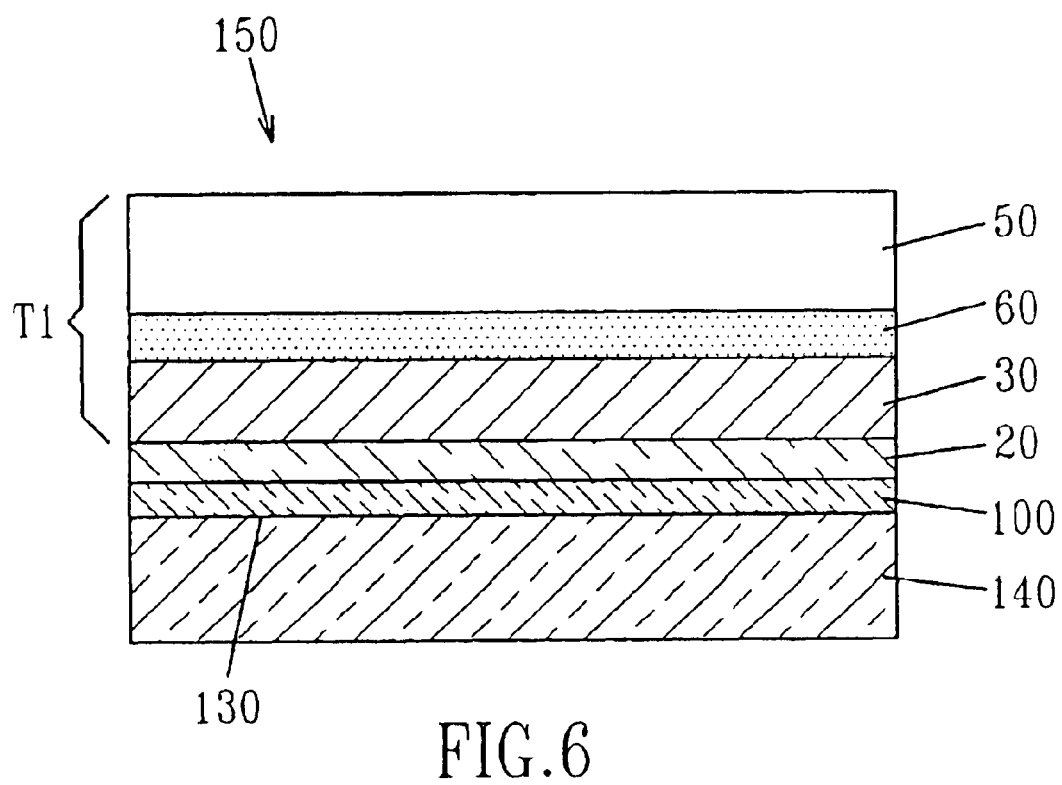
FIG. 6 shows the cross sectional view of the stack bonded to a sapphire wafer, where the sapphire wafer bonds to a layer of a low temperature oxide deposited on an oxide layer.

In order to strengthen the bond between the sapphire 140 and the exposed oxide surface 120, 130, the bonded stack 150 is annealed at a low temperature, which depends on the thickness of the bonding wafers. The first post sapphire bonding annealing temperature is kept sufficiently low to prevent any defect formation in the device layer 30 due to differences in the thermal coefficient of expansion (TCE) of the bonding materials, including the exposed oxide surface 120, 130, the sapphire substrate 140, and any adhesive 60, if present. The first post sapphire bonding annealing temperature is typically less than about 200° C. where a combined thickness T1 of the handling substrate 50 and the device layer 30 is less than about than 800 $\mu$m, and less than 280° C., where the combined thickness T1 of the handling substrate 50 and the device layer 30 is less than about 400 $\mu$m. The resultant structure following bonding to the sapphire substrate is depicted in FIGS. 5 and 6, where FIG. 6 includes a low temperature oxide layer 100. The bonded stack 150 may be annealed immediately after the bonding of the sapphire substrate 140 to the oxide surface 120, 130.

Figure 7A:
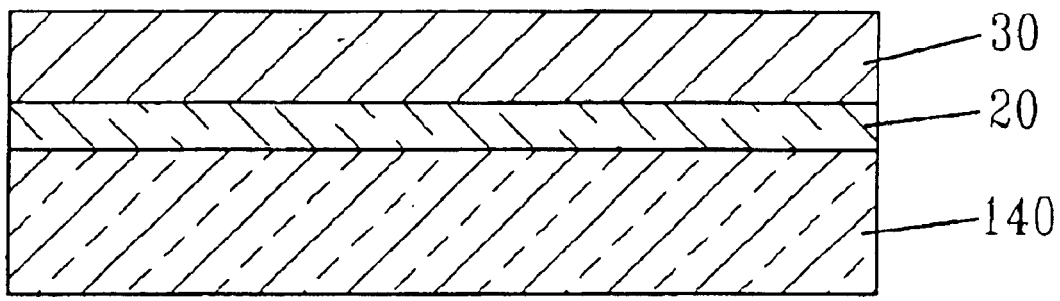
FIGS. 7A and 7B show the cross sectional views of the structure of FIG. 5 and FIG. 6 with the handling substrate being removed.
Figure 7B:
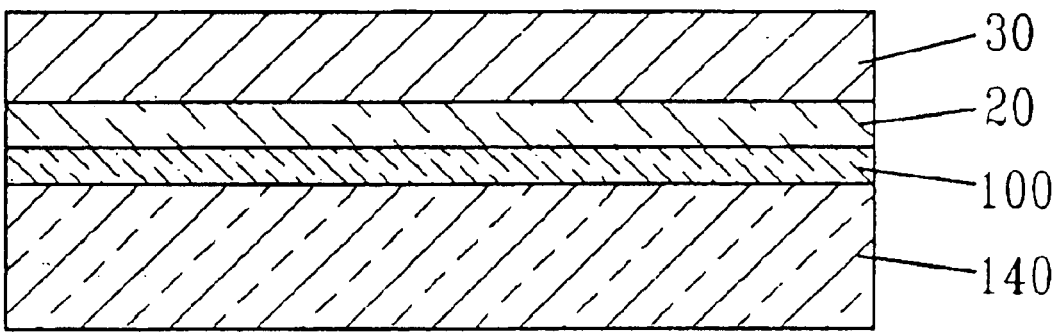

Referring to FIGS. 7A and 7B, the handling substrate 50 is removed from the device layer 30. There are several techniques that may be employed for removal of the handling substrate 50 including, but not limited to: wafer grinding, wet etching, dry etching, exfoliation, smart-cut, or combinations thereof. The handling wafer 50 removal technique may be dependent on the material of handling substrate 50 and the technique used for bonding the handling substrate 50 to the device layer 30.

In the preferred embodiment, in which the handling substrate 50 is a glass wafer bonded to the device region 30 by a polymer based adhesive 60, the polymer based adhesive 60 can be laser ablated by exposing it to laser radiation of an appropriate wavelength through the glass substrate. Subsequent to ablation, the glass handling substrate detaches from the polymer based adhesive 60. Alternatively, if the handling substrate 50 is a Si substrate attached using direct bonding, the handling substrate 50 may be removed using wafer grinding and wet etching.

Still referring to FIGS. 7A and 7B, following the removal of the handling wafer 50, the final structure, including at least device layer 30, oxide layer 20 and sapphire substrate 140, is annealed at a second post sapphire bonding temperature to further strengthen the interface bond between the exposed oxide surface 120 or 130 and the sapphire surface 140. The second post sapphire bonding annealing temperature is greater than the first post sapphire bonding annealing temperature. A higher anneal temperature is possible subsequent to the handle substrate removal 50, due to the significantly reduced thickness of the device layer 30 bonded to sapphire substrate 140. The final anneal temperature is $\leq 400°$ C. to prevent any degradation of the device back-end. For device layer thickness in excess of 50 $\mu$m, the final anneal temperature is limited to <300° C.

The following example is provided to further illustrate the present invention as well as some of the advantages obtained therefrom.

EXAMPLE

In this example the inventive process for the transfer of a device layer from the temporary substrate onto a sapphire substrate is described. The integrated circuit layer, or device layer 30, to be transferred was completely fabricated on a silicon-on-insulator substrate 40 where the oxide layer 20, forming the insulator, was $SiO_2$ and the device layer 30 was Si or SiGe.

The upper surface of the integrated circuit 30 was then bonded to a glass handling substrate 50 using a polymer based adhesive 60. The bulk of the temporary substrate 40 was then removed using wafer grinding. Any remaining portion of the temporary substrate 40 was then etched away by potassium hydroxide (KOH) and tetramethyl-ammonium hydroxide (TMAH), using the oxide layer 20 as an etch stop layer. The exposed oxide surface 120 was then polished using chemical-mechanical polishing (CMP) until the surface rough mean square (RMS) roughness was less than about 0.5 nm. The particulate residue from the CMP was cleaned from the exposed oxide surface 120 using a brush clean followed by either a de-ionized water rinse or a chemical cleaning composition.

The surface of the oxide layer 120 and the sapphire substrate 140 were then treated with Huang A ($NH_4OH:H_2O:H_2O$ 1:1:40) solution heated to about 70° C. The two bonding surfaces 120, 140 were then dried in a $N_2$ ambient. Following drying, the exposed oxide layer 120 was brought into contact with the sapphire substrate 140 forming a direct bond. Following direct bonding, the structure was annealed. More specifically, the structure comprising the bonded 200 mm diameter and 700 µm thick substrates were annealed at 150° C. for 20 hours. These anneal conditions sufficiently strengthened the interface bond to enable the removal of the glass handling substrate 50.

Removal of the glass-handling substrate 50 was achieved by ablating the polymer adhesive 60 with a laser of appropriate wavelength (approximately 308 nm), where the laser radiation was completely absorbed within the polymer. The glass handling substrate 50 was then removed by applying a small mechanical force. The remaining polymer adhesive was then removed in an oxygen plasma.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What we claim is:

1. A method of forming integrated circuits on a sapphire substrate comprising:
    providing a device layer on an oxide layer of a temporary substrate;
    bonding said device layer to a handling substrate;
    removing said temporary substrate to provide a structure containing said device layer between said oxide layer and said handling substrate;
    bonding a sapphire substrate to the oxide layer;
    first annealing at a first temperature to strengthen the bond between said oxide layer and said sapphire substrate; and
    removing said handling substrate from said device layer.

2. The method of claim 1 further comprising forming a low temperature oxide layer on said oxide layer prior to sapphire substrate bonding.

3. The method of claim 2 wherein said low temperature oxide layer is deposited onto said oxide layer by chemical vapor deposition, low-pressure chemical vapor deposition, or plasma enhanced chemical vapor deposition.

4. The method of claim 1 wherein said first temperature is less than about 200° C. where a combined thickness of said handling substrate and said device layer is less than about than 800 µm, or less than 280° C., where said combined thickness of said handling substrate and said device layer is less than about 400 µm.

5. The method of claim 1 wherein the sapphire substrate comprises bulk sapphire or a multilayered structure having an uppermost layer of sapphire.

6. The method of claim 1 further comprising a second anneal that is performed after said removing of the handling substrate at a second temperature, wherein said second temperature is greater than said first temperature.

7. The method of claim 2 wherein said low temperature oxide layer is annealed at a temperature less than about 400° C.

8. The method of claim 1 wherein said device layer further comprises an integrated circuit comprising a first region having at least one active device and a second region having at least one passive device.

9. The method of claim 8 wherein said at least one active device is selected from the group consisting of metal oxide semiconductor devices (MOS), complementary metal oxide semiconductor devices (CMOS), bipolar devices, modulation doped field effect (MODFET) devices, and combinations thereof.

10. The method of claim 8 wherein said passive regions comprise inductors, resistors, capacitors, transmission lines or combinations thereof.

11. The method of claim 1 wherein said temporary substrate comprises of Si, strained Si, SiC, SiGe, SiGeC, Si alloys, Ge, Ge alloys, GaAs, InAs, InP, other III–V or II–VI semiconductors and combinations thereof.

12. The method of claim 1 wherein said handling substrate comprises glass, quartz, silicon nitride, aluminum nitride, berylium oxide, sapphire, Si, strained Si, SiC, SiGe, SiGeC, Si alloys, Ge, Ge alloys, GaAs, InAs, InP, other III–V or II–VI semiconductors, or combinations thereof.

13. The method of claim 1 wherein bonding said device layer to said handling substrate comprises contacting said device layer and said handling substrate with a glue or polymer adhesive.

14. The method of claim 1 wherein said banding of said oxide layer to said sapphire substrate comprises contacting said oxide layer and said sapphire substrate with a glue or polymer adhesive.

15. The method of claim 1 wherein said bonding of said oxide layer to said sapphire substrate further comprises a direct bonding wafer process.

16. The method of claim 15 wherein said bonding is a direct bonding wafer process which comprises surface treating said oxide layer and said sapphire substrate with oxygen, ammonia, or water plasma.

17. The method of claim 15 wherein said bonding of said sapphire substrate to said oxide layer comprises chemically treating said oxide layer and said sapphire substrate using a wet chemical treatment.

18. The method of claim 1 wherein a top surface of said sapphire substrate and said oxide layer are chemically mechanically processed to a root mean square surface roughness value of less than about 0.5 nm prior to said bonding of said sapphire substrate to said oxide layer.

19. The method of claim 1 wherein said handling substrate is removed by wafer grinding, wet etching, dry etching exfoliation, smart-cut, laser ablation of polymer adhesive or combinations thereof.

* * * * *